United States Patent [19]

Lauro et al.

[11] Patent Number: 4,911,810
[45] Date of Patent: Mar. 27, 1990

[54] MODULAR SPUTTERING APPARATUS

[75] Inventors: Michael P. Lauro, Lincoln; Roland Beaulieu, Tiverton; Everett E. Crissman, Woonsocket; Joseph J. Loferski, Providence, all of R.I.; Christopher Case, New Providence, N.J.

[73] Assignee: Brown University, Providence, R.I.

[21] Appl. No.: 209,557

[22] Filed: Jun. 21, 1988

[51] Int. Cl.[4] .................................. C23C 14/56
[52] U.S. Cl. ............................ 204/192.12; 204/298
[58] Field of Search .............. 204/192.12, 192.15, 204/298 MS, 298 MC, 298 EM, 298 SM; 118/718, 719; 414/217, 221

[56] References Cited

U.S. PATENT DOCUMENTS

| | | | |
|---|---|---|---|
| 2,305,758 | 12/1942 | Berghaus et al. | 204/192.12 |
| 2,405,662 | 8/1946 | McManus et al. | 204/192.32 |
| 2,825,687 | 3/1958 | Preston et al. | 204/192.29 |
| 2,965,067 | 12/1960 | Amelotte et al. | 118/718 |
| 3,294,670 | 12/1966 | Charschan et al. | 204/298 |
| 3,314,873 | 4/1967 | Lunsford | 204/192.21 |
| 3,367,667 | 2/1968 | Allan | 118/733 |
| 3,409,529 | 11/1968 | Chopra et al. | 204/192.11 |
| 3,437,888 | 4/1969 | Hall | 357/71 |
| 3,475,315 | 10/1969 | Moseson | 204/298 |
| 3,521,765 | 7/1970 | Kaufmann et al. | 414/217 |
| 3,584,847 | 6/1971 | Hammond, Jr. et al. | 432/86 |
| 3,616,402 | 10/1971 | Kumagai | 204/192.12 |
| 3,616,406 | 10/1971 | Turner | 204/192.12 |
| 3,630,872 | 12/1971 | Reichelt | 204/192.17 |
| 3,652,444 | 2/1972 | Lester et al. | 204/298 |
| 3,740,327 | 6/1973 | Lane et al. | 204/298 |
| 3,761,372 | 9/1973 | Sastri | 204/192.15 |
| 3,761,373 | 9/1973 | Sastri | 204/192.15 |
| 3,787,312 | 1/1974 | Wagner et al. | 204/298 |
| 3,849,283 | 11/1974 | Jackson et al. | 204/298 |
| 3,856,654 | 12/1974 | George | 204/298 |
| 3,890,109 | 6/1975 | Jones | 428/626 |
| 3,904,503 | 9/1975 | Hanfmann | 204/192.12 |
| 3,925,182 | 12/1975 | Carmichael et al. | 204/192.27 |
| 3,933,644 | 1/1976 | Skinner et al. | 204/298 |
| 3,968,018 | 7/1976 | Lane et al. | 204/192.3 |
| 4,034,142 | 7/1977 | Hecht | 428/678 |
| 4,102,768 | 7/1978 | Kearin et al. | 204/192.29 |
| 4,124,472 | 11/1978 | Riegert | 204/192.16 |
| 4,145,481 | 3/1979 | Gupta et al. | 428/678 |
| 4,166,018 | 8/1979 | Chapin | 204/192.12 |
| 4,278,528 | 7/1981 | Keuhnle et al. | 204/298 |
| 4,303,489 | 12/1981 | Morrison, Jr. | 204/192.12 |
| 4,313,815 | 2/1982 | Graves, Jr. et al. | 204/298 |
| 4,322,276 | 3/1982 | Meckel et al. | 204/192.26 |
| 4,331,526 | 5/1982 | Kuehnle et al. | 204/192.13 |
| 4,336,117 | 6/1982 | Brainard et al. | 204/192.16 |
| 4,337,133 | 6/1982 | Augis et al. | 204/192.17 |
| 4,369,730 | 1/1983 | Izu et al. | 118/723 |
| 4,427,520 | 1/1984 | Bahnsen et al. | 204/224 R |
| 4,405,435 | 9/1983 | Tateishi et al. | 204/298 |
| 4,415,421 | 11/1983 | Sasanuma | 204/192.31 |

(List continued on next page.)

FOREIGN PATENT DOCUMENTS

| | | | |
|---|---|---|---|
| 2919191 | 11/1979 | Fed. Rep. of Germany | 204/192.16 |
| 52-21283 | 2/1977 | Japan | 204/192.16 |
| 54-32183 | 3/1979 | Japan | 204/192.16 |
| 58-09976 | 1/1983 | Japan | 204/192.16 |

OTHER PUBLICATIONS

Torr Vac Co. Specification No. 1051, Apr. 1984, of "Model 4000 Vertical, In-Line Sputter Deposition System".

Primary Examiner—Aaron Weisstuch
Attorney, Agent, or Firm—Curtis, Morris & Safford

[57] ABSTRACT

A sputtering apparatus is constructed in modular form to facilitate changes in sputtering processes and target materials. At least two sputtering modules and a pumping stack module are arranged in series and in any desired order between a load module and an exit module. Each module is attached to another module by sealingly abutting flanges which are connected by externally accessible bolts. The use of gate valves between the modules is avoided by the provision of connecting sleeves which are each at least as long as the mean free path of the sputtered target atoms.

30 Claims, 4 Drawing Sheets

U.S. PATENT DOCUMENTS

| | | | |
|---|---|---|---|
| 4,420,385 | 12/1983 | Hartsough | 204/192.23 |
| 4,426,267 | 1/1984 | Munz et al. | 204/192.12 |
| 4,434,037 | 2/1984 | Crank | 204/192.12 |
| 4,461,239 | 7/1984 | Cannella et al. | 118/718 |
| 4,470,895 | 9/1984 | Coad et al. | 204/192.15 |
| 4,491,509 | 1/1985 | Krause | 204/192.12 |
| 4,492,181 | 1/1985 | Ovshinsky et al. | 118/718 |
| 4,495,254 | 1/1985 | Hoffman | 428/632 |
| 4,498,416 | 2/1985 | Bouchaib | 118/719 |
| 4,501,428 | 2/1985 | Ueno et al. | 277/12 |
| 4,508,612 | 4/1985 | Blackwell et al. | 204/298 |
| 4,517,217 | 5/1985 | Hoffman | 428/632 |
| 4,533,605 | 8/1985 | Hoffman | 428/635 |
| 4,542,711 | 9/1985 | Izu et al. | 118/718 |
| 4,552,092 | 11/1985 | Yanagi et al. | 118/718 |
| 4,556,471 | 12/1985 | Bergman et al. | 204/298 |
| 4,564,430 | 1/1986 | Bacon et al. | 204/206 |
| 4,587,002 | 5/1986 | Bok | 204/298 |
| 4,591,418 | 5/1986 | Snyder | 204/192.16 |
| 4,592,306 | 6/1986 | Gallego | 118/719 |
| 4,593,644 | 6/1986 | Hanak | 118/719 |
| 4,595,482 | 6/1986 | Mintz | 204/298 |
| 4,597,845 | 7/1986 | Bacon et al. | 204/206 |
| 4,599,135 | 7/1986 | Tsunekawa et al. | 156/643 |
| 4,599,970 | 7/1986 | Peterson | 118/504 |
| 4,604,179 | 8/1986 | Eltoukhy et al. | 204/298 |
| 4,659,606 | 4/1987 | Wada et al. | 428/141 |
| 4,661,229 | 4/1987 | Hemming et al. | 204/192.13 |
| 4,663,009 | 5/1987 | Bloomquist et al. | 204/192.2 |
| 4,670,126 | 6/1987 | Messer et al. | 204/298 |
| 4,675,096 | 6/1987 | Tateishi et al. | 204/298 |
| 4,692,233 | 9/1987 | Casey | 204/298 |
| 4,693,777 | 9/1987 | Hazano et al. | 156/345 |
| 4,693,803 | 9/1987 | Casey et al. | 204/298 |
| 4,722,298 | 2/1988 | Rubin et al. | 118/715 |
| 4,725,482 | 2/1988 | Komoda et al. | 428/215 |
| 4,763,601 | 8/1988 | Saida et al. | 118/718 |
| 4,784,739 | 11/1988 | Kadokura et al. | 204/192.2 |
| 4,798,663 | 1/1989 | Herklotz et al. | 204/298 |

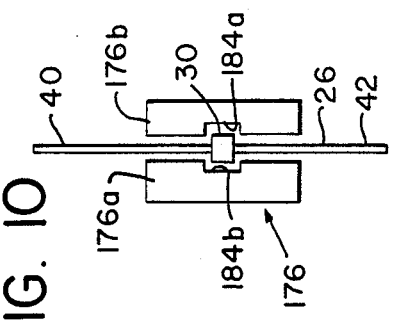
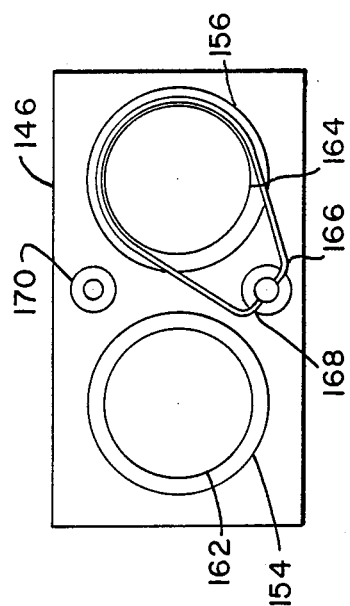
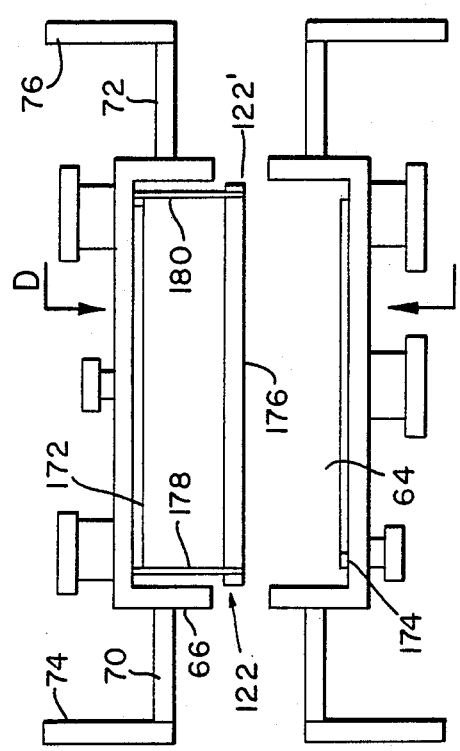
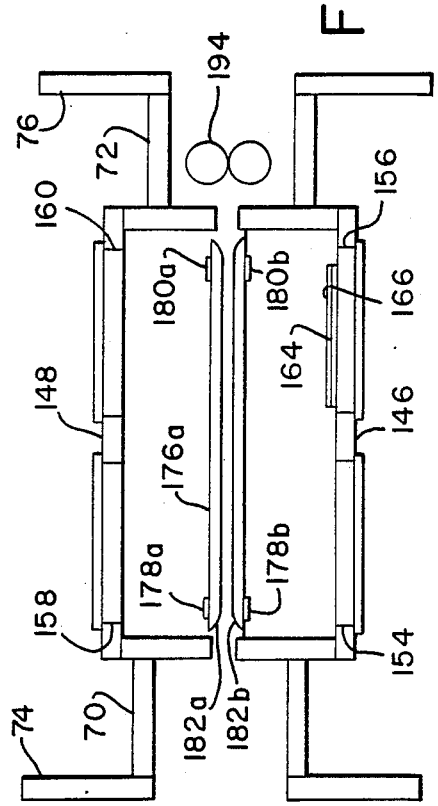

MODULAR SPUTTERING APPARATUS

FIELD OF INVENTION

The present invention is directed to sputtering apparatus for coating a substrate with a target material, and more specifically is directed to modular sputtering apparatus which includes two or more sputtering modules and a pumping stack module arranged in series.

BACKROUND OF THE INVENTION

Sputtering is a process in which a target is bombarded by energetic particles, generally ions of a heavy inert gas such a argon, causing atoms (or molecules) of the target material to be ejected from the surface of the target. Sputtering may be used as a method of coating a substrate with target material or as a method of surface etching, in which case the substrate itself is the target and its surface layer is removed by the bombarding ions.

In diode sputtering, a dc voltage, applied between the target and the substrate, is increased until the working gas breaks down and produces the plasma consisting of both ions and electrons. Since the target is negatively charged (i.e. it is the cathode), the positive ions are attracted to the target. They impinge on it with sufficient energy to dislodge atoms or molecules of the target material. The substrate is positioned so as to intercept the flux of sputtered target atoms, which condense to form a coating of the target material.

The density of the working gas is adjusted so that it is sufficient to provide a high flux of ions bombarding the target, but not so high that the atoms and/or molecules ejected from the target collide with inert working gas atoms before they arrive at the target. As noted above, there is an electric field between the target and the substrate which accelerates the bombarding gas ions toward the target. This same electric field accelerates the electrons toward the substrate where they generally produce radiation damage. The electron flux also generates ions in the vicinity of the substrate where they are not useful for sputtering. These undesirable effects associated with the full electron flux can be obviated by recourse to magnetron sputtering. The cathode of a magnetron sputtering system incorporates magnets which confine the electrons in the region close to the target, thus increasing the ion density in that region and, therefore, increasing the density of atoms or molecules ejected from the target. Rf power is used for sputtering from insulating targets in either diode or magnetron configurations. The use of rf power prevents build-up of charge on an insulating target.

One particularly advantageous feature of the sputtering process is that the target material passes into the vapor phase by a mechanical process of kinetic energy exchange, rather than by a chemical or thermal process. As a result, virtually any material, conducting or nonconducting, may be used as the target material. Sputtering is therefore advantageous in providing uniform coatings of different types of materials in thin layers or films. It is used, for example, in semiconductor integrated circuit manufacturing processes or in the coating of, for example, the edge of cutting instruments with desired coating materials such as refractory metals and alloys, corrosion resisting metals and alloys, plastic coatings for lubrication or other purposes, and the like. See, for example, U.S. Pat. No. 3,968,018 (Lane et al.)

As the use of sputter coating expands beyond the creation of ultra high purity thin films in integrated circuit manufacturing into more generalized areas, such as in Lane et al., it is important to ensure that the process becomes commercially feasible. For example, one area which, prior to the present invention, failed to employ sputtering as a coating method is the coating of one metal with another metal to produce the products conventionally produced by electroplating. Electroplating is used, for example, to provide conducting contacts on metal connectors or to cover a base metal with a precious metal. A serious problem with the electroplating process is that it produces highly polluting waste fluids and materials. The cost of dealing with these polluting waste products is borne either by the electroplating manufacturer, thereby increasing his cost of production, or is borne by the environment and society at large when dumping is either permitted or condoned. There has been a long-felt need in the electroplating field to provide a substitute process which would produce the same manufactured goods but without the polluting waste products or the additional expense of disposing of the same.

There are other problems in conventional electroplating processes which, as described below, may be solved in accordance with the present invention by using sputter coating. First, electroplating is performed in vats and results in the loss of significant amounts of the coating material which cannot be easily reclaimed from the waste liquids. When the coating material is a precious metal such as gold, its loss can be very costly. The present invention provides reclamation of virtually all the target material which does not coat the substrate itself. Secondly, the coatings produced by conventional electroplating processes are fairly thick, being measured in thousandths of an inch, and are frequently nonuniform both in thickness and in film morphology, i.e. in internal structure and surface characteristics. The apparatus in accordance with the present invention, on the other hand, can provide films of uniform morphology and of any desired thickness own to only a few atoms thick. Yet to date no one has proposed that a sputtering process be used in place of commercial electroplating.

One possible reason for this is that electroplating manufacturers are faced with two competing goals. On the one hand, they may have to deal with large jobs in which a high production rate of identical products must be produced. On the other hand, electroplating manufacturers are generally obliged to provide a number of different products, including different substrates covered with one or more different materials. A sputtering apparatus dedicated to a single sputtering process would be commercially undesirable. Any sputtering apparatus intended to replace electroplating should advantageously accommodate both a high production rate and the rapid and efficient interchange of substrates and coating materials.

Conventional sputtering systems have further disadvantages, some of which are now mentioned. A heavy substrate fed through a horizontal apparatus may sag and be unevenly coated. When only a portion of the substrate is to be coated, it has been necessary to affix an individual mask directly thereon. The positional relationship between the substrate and the target is fixed, and it is impossible to change a target or clean or repair the internal sputtering chambers without disassembling the entire apparatus. A separate vacuum pump has been used for each sputtering chamber in a multiple chamber apparatus, with vacuum leak valves or other mechanical means between chambers being necessary to prevent cross-contamination by the different target materials. The vacuum pumps may have to be regenerated at intervals, resulting in down time for the apparatus. In short, while complicated and expensive sputtering apparatus is available for specific sputtering processes, no conventional sputtering apparatus provides the versatility and other features to make its use in the coating and/or electroplating industry commercially advantageous.

OBJECTS AND SUMMARY OF THE INVENTION

Accordingly, it is an object of the present invention to provide a sputtering apparatus which avoids the above-mentioned difficulties of the prior art.

It is another object of the present invention to provide a sputtering apparatus which is modular.

It is another object of the present invention to provide a sputtering apparatus comprised of a serial arrangement of sputtering modules which may be arranged in any order between a load module and an exit module.

It is still another object of the present invention to provide a modular sputtering apparatus which can operate in either a continuous or a step-wise fashion.

It is yet another object of the present invention to provide modular sputtering apparatus in which a substrate may be coated with a first metal in a first sputtering module and thereafter coated with a second metal in a second sputtering module.

It is a further object of the present invention to provide sputtering apparatus in which only selected portions of the substrate are coated.

It is a further object of the present invention to provide modular sputtering apparatus which minimizes down time due to vacuum pump regeneration.

It is yet a further object of the present invention to provide modular sputtering apparatus which avoids the use of separate vacuum pumps for each sputtering module and gas seals between sputtering modules.

It is yet a further object of the present invention to provide modular sputtering apparatus which permits access to the individual sputtering modules without requiring disassembly of the modules from each other.

It is yet a further object of the present invention to provide modular sputtering apparatus in which the position of one or more sputtering cathodes may be adjusted relative to the position of the substrate.

It is yet a further object of the present invention to provide modular sputtering apparatus through which the substrate may pass horizontally or vertically.

It is still a further object of the present invention to provide sputtering apparatus in which substantially all the target material is used or reclaimed.

It is still a further object of the present invention to provide apparatus producing coatings of highly uniform film morphology.

In accordance with an aspect of the present invention, a modular sputtering apparatus for coating a substrate with a target material comprises a load module including an end wall having an aperture therein and a sleeve extending from the end wall and surrounding the aperture, the sleeve having an outwardly directed flange at a free end thereof, at least two sputtering modules each including a central sputtering chamber having first and second opposed end walls with respective apertures therein and having first and second sleeves extending from said first and second end walls, respectively, and surrounding the respective apertures, each of the first and second sleeves having an outwardly directed flange at a free end thereof, a pumping stack module including at least one vacuum pump attached thereto and a vacuum cavity with first and second opposed sleeves each having an outwardly directed flange at a free end thereof, an exit module including an end wall having an aperture therein and a sleeve extending from the end wall and surrounding the aperture therein, the sleeve of the exit module having an outwardly directed flange at a free end thereof means within the load module for supplying a substrate therefrom, means within the exit module for receiving the substrate thereat, each of the flanges on each of the modules being adapted to sealingly abut another one of the flanges on another one of the modules so that the first and second sputtering modules and the pumping stack module may be serially arranged between the load module and the exit module with the vacuum cavity and all of the apertures being in alignment to form a sealed passage, the substrate being passed from said load module through the sealed passage to said exit module, and externally accessible securing means for respectively releasably securing together abutting ones of the flanges, whereby the first and second sputtering modules and the pumping stack module may be serially arranged between the load module and the exit module in any order. Advantageously, all the flanges on all of the modules are of identical construction. The flanges and respective sleeves can be replaced by any appropriate device which sealably connects the sputtering modules.

The one of the sputtering modules arranged next following the load module may advantageously be a sputter etching module adapted to sputter etch the substrate, and each of the sputtering modules may include one or more doors openable and closable independently of the respective securing means for permitting access to the central or interior sputtering chamber of the respective sputtering module. One or more sputtering cathodes ay be mounted on each of the doors.

In a further development of the present invention, the first sputtering module is adapted to sputter a first target material onto the substrate under first sputtering conditions, the first target material having a first mean free path under the first sputtering conditions, and the second sputtering module is adapted to sputter a second target material onto the substrate under second sputtering conditions, the second target material having a second mean free path under the second sputtering conditions, a length of each of the sleeves of the first and second sputtering modules being at least as great as the longer of the first and second mean free paths.

These and other objects, aspects and features of the present invention will become apparent from the following detailed description of a preferred embodiment thereof taken in connection with the accompanying drawings, throughout which like reference numerals denote like elements and the parts.

BRIEF DESCRIPTION OF THE DRAWINGS

FIG. 5 is a cross sectional view of the sputtering module of FIG. 3 taken along arrows B—B of FIG. 4;

FIG. 7 is a cross sectional view of the sputtering module of FIG. 3 taken along arrows C—C of FIG. 3;

FIG. 9 is an elevational view of the inside of a door of the sputtering module of FIG. 3;

FIG. 10 is a cross sectional view of the fixed mask taken along arrows D—D of FIG. 5;

DETAILED DESCRIPTION OF THE PREFERRED EMBODIMENT

Figure 1:
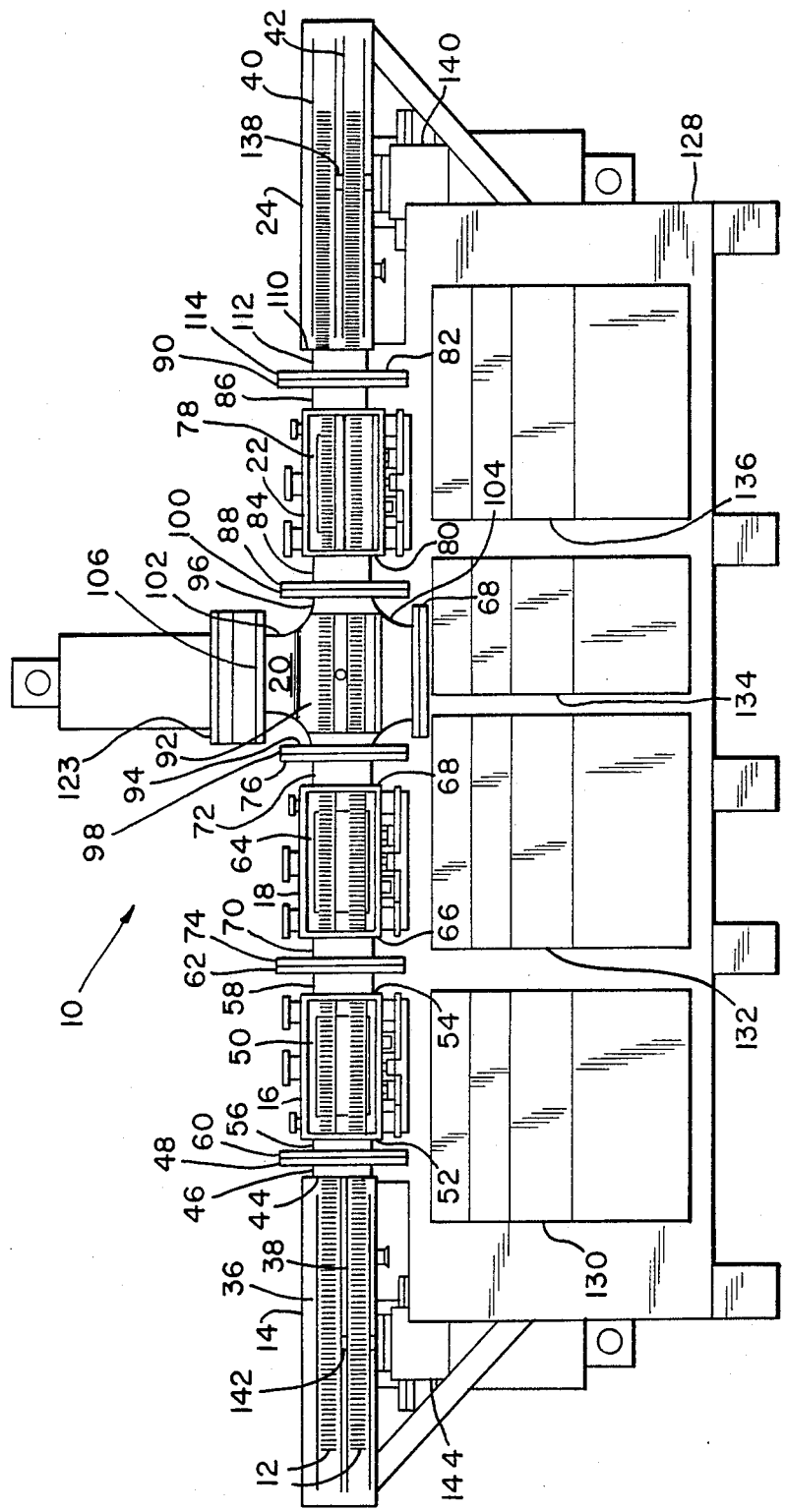
FIG. 1 is a side elevational view, partly in cross section, of a preferred embodiment of sputtering apparatus in accordance with the present invention.
Figure 2:
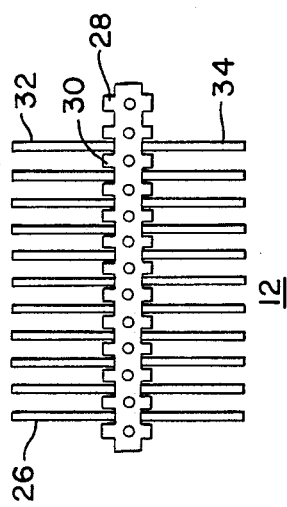
FIG. 2 is an elevational view of a bandolier substrate which may be processed in the apparatus of FIG. 1.

Referring now to the drawings and initially to FIG. 1 thereof, a sputtering apparatus 10 in accordance with the present invention is formed as a serial arrangement of modules. These modules include, in the order in which a substrate 12 passes therethrough from left to right, a load module 14, a first sputtering module utilized as a sputter etching module 16, a second sputtering module 18, a pumping stack module 20, a third sputtering module 22 and an exit module 24. Each module is illustrated in FIG. 1 with its near sidewall removed to show the substrate 12 in its path of travel through apparatus 10. Load module 14 stores the substrate 12 which is to be sputtered and supplies the same therefrom through sputtering apparatus 10 to exit module 24, where the sputter coated substrate 12 is received. In the illustrated embodiment as shown in FIG. 2, substrate 12 is in the form of an elongated bandolier of thin metal strips 26 which are to be processed into electrical connectors. The metal strips 26 are attached to a flexible metal web 28 in a direction perpendicular to the web's longitudinal direction, so that web 28 may be wrapped into a coil. Each metal strip 26 is attached to web 28 to form an expanded central section 30 and has an upper tip 32 and a lower tip 34. As shown in FIG. 1, two such substrates 12 are wrapped around respective upper and lower supply reels 36, 38. It will be understood that only one substrate, or three or any other number of substrates, may be provided instead. After passing through apparatus 10, these two substrates 12 are received in exit module 24 on respective upper and lower take-up reels 40, 42. As will be described in more detail below, in the process using the serial arrangement of FIG. 1 each metal strip 26 of substrate 12 is cleaned by sputter etching in sputter etching module 16, is coated over its entire surface with a first metal in sputtering module 18 and is coated over upper and lower tips 32, 34 in second sputtering chamber 22.

The sputtering modules 16, 18 and 22 and pumping stack module 20 are all constructed in modular form so that they may be arranged between load module 14 and exit module 24 in any desired order. To this end, load module 14, which may be cylindrical, is formed here as a box-like receptacle having an end wall 44 from which a sleeve 46 extends. Sleeve 46, which also may be either cylindrical or rectangular in cross section, terminates at a free end thereof in an outwardly directed flange 48. Sputter etching module 16 is similarly formed as a box-like container having a central sputtering cavity 50 terminating in first and second opposed end walls 52 and 54 from which respectively extend first and second sleeves 56, 58 terminating at a free end thereof in outwardly directed flanges 60, 62. Sputtering modules 18 and 22 have an outer construction identical to that of sputter etching module 16, although the arrangement of etching/masking elements differs inside the respective central sputtering cavities of the modules 16, 18 and 22. These etching/masking elements are removable and interchangeable, so that any of sputtering modules 16, 18 and 22 may be readily adapted to sputter or sputter etch substrate 12. The identical outer construction of the modules means that sputtering module 18 includes central sputtering cavity 64, first and second end walls 66, 68, first and second sleeves 70, 72 and first and second flanges 74, 76, while sputtering module 22 includes central sputtering cavity 78, first and second end walls 80, 82, first and second sleeves 84, 86 and first and second flanges 88, 90. Pumping stack module 20 is formed with a central vacuum cavity 92, first and second opposed sleeves 94, 96 and first and second outwardly directed flanges 98, 100 at the end of sleeves 94, 96. Pumping stack module 20 is symmetrical along each of its three orthogonal axes and thus further includes third and fourth sleeves 102, 104, terminating in third and fourth flanges 106, 108, which extend vertically and perpendicularly to the path of travel of substrate 12. Also present on pumping stack module, ut not illustrated in FIG. 1, are fifth and sixth sleeves terminating respectively in fifth and sixth outwardly directed flanges which extend horizontally and perpendicularly to the path of travel of substrate 12. As discussed below, each of the six sleeves of pumping stack module 20 is a port adapted to be connected either to a vacuum pump or a sputtering or other module, or may be simply capped.

Lastly, exit module 24 includes an end wall 110, a sleeve 112 extending therefrom and terminating at a free end thereof in an outwardly directed flange 114.

Each of the flanges on each of the modules is adapted to sealingly abut any other one of the flanges on other one of the modules. To this end, all of the flanges advantageously may be of identical construction. One commercially available example of a flange which may be used for this purpose is the ASA flange, available from, e.g. Varian Associates or Velco. Because in this embodiment all the flanges are of identical construction, a description of flange 74 of sputtering module 18 will be given, but it will be understood that this description applies equally to all of the remaining flanges in apparatus 10.

Figure 4:
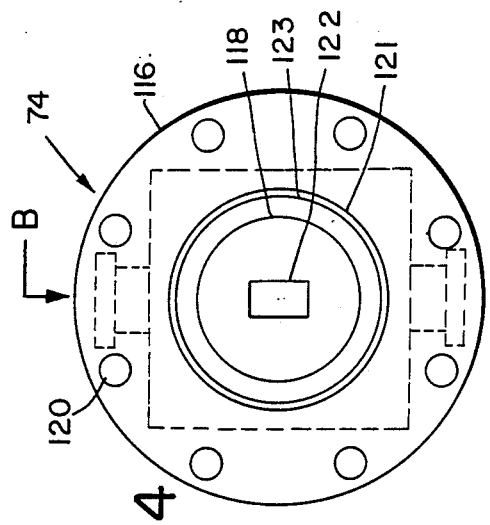
FIG. 4 is a front elevational view of the module of FIG. 3, with a cross sectional projection taken along arrows A—A of FIG. 3.
Figure 3:
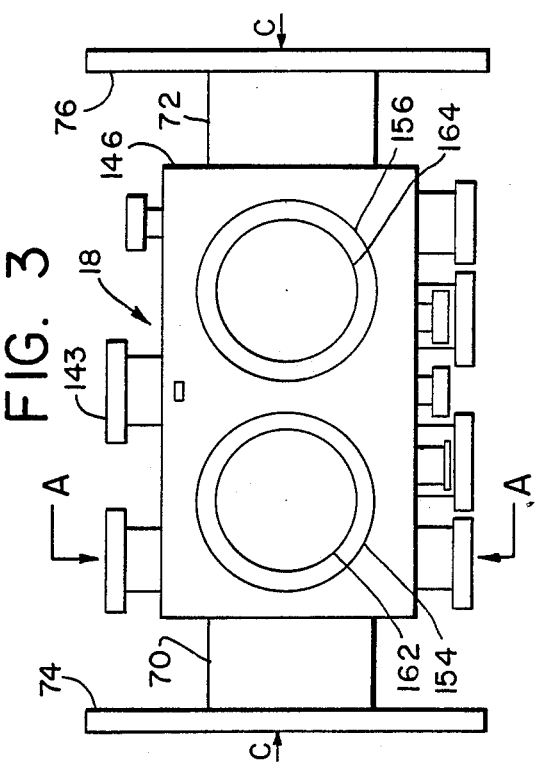
FIG. 3 is a side elevational view of a sputtering module of the apparatus of FIG. 1.

Referring to FIGS. 3 and 4, it will be seen that flange 74 is generally annular in shape having an outer circumference 116 and an inner circumference 118. Spaced around the outer portion of flange 74 are a plurality, for example, six, bolt holes 120, which extend entirely through flange 74. A circular groove 121 having a semicircular cross-section is located on the front surface of flange 74 between bolt holes 120 and inner circumference 118. The remaining front surface of flange 74 between outer circumference 116 and inner circumference 118 is flat. An elastomeric gasket or O-ring 123, e.g., a VITON ® O-ring is positioned in groove 121 so that, when flange 74 is brought into contact with another one of the flanges of another one of the modules, which in the arrangement illustrated in FIG. 1 is flange 62 of sputter etching module 16, the two flanges 74, 62 sealingly abut to form a gas proof seal. In this orientation, bolt holes 120 of flange 74 are aligned with corresponding bolt holes of flange 62, and six bolts or similar securing devices may be passed through bolt holes 120 through both of flanges 62 and 74 and externally tightened with, for example, nuts.

This structure for connecting the several modules has two advantages. First, since each of the flanges on each of the modules is adapted to sealingly abut any other one of the flanges on any other one of the modules, the three sputtering modules 16, 18 and 22 and pumping stack module 20 may be serially arranged between load module 14 and exit module 24 in any desired order. Any number of such modules having such identical flanges may be added or subtracted from serial arrangement without impairing the operation of apparatus 10. Thus, if only sputter etching is to be performed, the serial arrangement could consist simply of sputter etching module 16 and pumping stack module 20. One or both of sputtering modules 18 and 22 may be used, or other sputtering modules may be added. If sputter etching is not required in any particular process, sputter etching module 16 may be removed or converted to a sputtering module. This modular construction thus provides, in part, the advantageous versatility of the apparatus according to the present invention.

The use of identical structure as described above on each of the modules has a second advantage. Specifically, the bolts or other securing means may be released and removed from bolt holes 120 on, for example, flanges 74 and 7 of sputtering module 18 (together with removal from the bolt holes of flanges 62 and 98 of modules 16 and 20, respectively). Sputtering module 18 may then be removed from the serial arrangement without requiring disassembly of the entire apparatus 10, so that module 16 remains attached to load module 14, while pumping stack module 20, sputtering module 22 and exit module 24 also remain connected. A different sputtering module may then be inserted in the serial arrangement in place of sputtering module 18, or sputter etching module 16 may be connected directly to pumping stack module 20.

Furthermore, each of the sleeves of each of the modules may be optionally provided with a gate valve which may be closed to seal off the sleeve. If such gate valves provided in sleeve 58 of sputter etching module 16 ad sleeve 94 of pumping stack module 20 are closed, then sputtering module 18 may be opened for repair or removed without impairing the vacuum in the rest of apparatus 10. If a new sputtering module is placed between sputter etching module 16 and pumping stack module 20, or sputtering module 18 is closed, only the atmosphere of one such module must be pumped out before operation can begin, thus decreasing the down time of apparatus 10 and putting less strain on the pumps.

Advantageously, all the sleeves on sputter etching module 16 and sputtering modules 18, 22 are of identical construction and may be either rectangular or cylindrical. The six opposed sleeves on pumping stack module 20 may also be of the same construction as the remaining sleeves, or may have a trumpet shaped configuration, as illustrated in FIG. 1. Similarly, sleeve 46 on load module 14 and sleeve 112 on load module 24 may have the same construction as the opposed sleeves on the sputtering modules.

Referring again to FIG. 3, flange 74 is outwardly directed from sleeve 70. As shown in FIG. 5, interior circumference 118 of flange 74 may coincide precisely with the interior circumference of sleeve 70, or it may extend slightly inwardly thereof. Sleeve 70 is advantageously centered on end wall 66 and surrounds an aperture 122 which extends through end wall 66 into the central sputtering cavity 64. Aperture 122 is advantageously centrally located on end wall 66, but whether it is centrally located or not, each end wall of load module 14, sputter etching module 16, sputtering modules 18 and 22 and exit module 24 includes a corresponding aperture 122', and these apertures are located on their respective end walls so that, when the several modules are serially arranged with their respective flanges abutting and secured, the vacuum cavity 92 of pumping stack module 20 and all of the apertures 122, 122' in all of the modules are in alignment to form a sealed passage through which substrate 12 may pass from load module 14 to exit module 24. It is to be noted that in this illustrated embodiment of the present invention, no gas seals or other sealing devices (as opposed to the optional gate valves discussed above) are required between the sputtering modules to prevent the target material from leaving the respective cavities, but rather a continuous sealed passage is formed throughout the entire apparatus, which sealed passage is pumped down to an appropriate vacuum level by one or more vacuum pumps 123 (FIG. 1) mounted on corresponding ports formed by the flanges of pumping stack module 20.

The purpose in having all of the sleeves on all of the sputtering modules be of identical construction is related to the absence of gas seals between the various modules. During the sputtering process each sputtering module will be filled with a flux of atoms of the target material, whether from a sputtering cathode or from the substrate itself. Under the particular sputtering conditions in each sputtering module, which includes such variables as the pressure, temperature, the use of magnetic fields from magnetrons, the number and position of sputtering cathodes and other conditions, the atoms of each target material which have been ejected from the target will have an associated collective mean free path. The mean free path is the average distance which each atom of one type of target material under specific sputtering conditions will travel before it collides with another atom in the plasma, generally with one of the bombarding ion atoms. When two sputtering modules are positioned close together, for example, as in the system illustrated in the above-referenced Lane et al. patent, it is entirely possible that an atom of one target material may travel from its own sputtering module into the next adjacent sputtering module, where it may become deposited on the substrate therein, thus contaminating the layer of the second target material being deposited on the substrate in the second sputtering module. It is for this reason that vacuum gate valves, gas seals or other sealing devices which pass the substrate but not the target flux, are generally interposed between sputtering chambers, and indeed such gas seals are used in the Lane et al. apparatus. However, such gas seals which allow the passage of the substrate but not the gases therethrough of necessity add to the expense and complexity of the sputtering apparatus, and may even have to be individually adapted to the specific target material used in a particular sputtering module. This reduces the versatility of the apparatus.

In the present apparatus 10 according to the present invention, it is contemplated that two sputtering modules, such as sputter etching module 16 and sputtering module 18, will be located in sequence in the serial arrangement between load module 14 and exit module 24, and that sputtering or sputter etching in all the sputtering modules will be taking place simultaneously. In the type of coating processes contemplated for use in the apparatus 10 according to the present invention, a small amount of cross-contamination of target material is acceptable. It has been found by the present inventors that if the effective sputtering volume of the two central sputtering cavities 50, 64 of the two adjacent sputtering modules 16, 18 are separated by at least twice the longer of the mean free paths of the two target materials, then the amount of cross-contamination between the two sputtering modules 16, 18 is substantially reduced. The effective sputtering volume here is measured from end wall to end wall within the module. It may be less than the total length of the module if the module is made longer. The reason for this low level of cross-contamination is believed to be that the target atoms will collide with and adhere to the inner surfaces of the sleeves or will be reversed in direction before they reach the next adjacent central sputtering cavity. Therefore, by making each of the sleeves of each of the sputtering modules at least as long as the longer of the two mean free paths, then the separation between the two central sputtering cavities 50, 64 will be at least twice the longer of these two mean free paths, and therefore the level of cross-contamination will be sufficiently low that vacuum gate valves or gas seals between the sputtering modules may be completely eliminated. Simple gate valves to seal off the modules during repair or reordering of the modules, as discussed above, may still be optionally provided.

Although in the illustrated embodiment the sleeves are of fixed length, they may alternatively be constructed to be adjustable in length to accommodate different mean free paths.

Not only does this construction eliminate the need for gas seals, but it also makes it possible to use a single pumping stack module 20 to evacuate all of the sputtering modules 16, 18, 22 in the entire apparatus 10. This is advantageous in a process where the evacuation level in each sputtering module is the same. In the processes used to substitute for electroplating, it is contemplated that such constant evacuation is acceptable, and it i believed that this will be true for many other processes. In those processes in which different levels of evacuation are necessary, however, vacuum gate valves or gas seals between some or all of the sputtering modules may be provided with individual vacuum pumps and/or pumping stack modules for each of the different evacuation levels. When two or more vacuum pumps 123 are provided on pumping stack module 20, vacuum gate valves may be provided so that each vacuum pump may be individually isolated for regeneration or replacement.

Whenever at least two sputtering modules are to be pumped to a single evacuation level, as for example, sputtering modules 18 and 22 of apparatus 10, it is advantageous to position pumping stack module 20 between the two sputtering modules 18, 22. This further increases the distance between the central sputtering cavities of sputtering modules 18 and 22 and reduces the cross-contamination level even further.

As shown in FIG. 1, apparatus 10 is advantageously mounted on a table 128 which physically supports each of the modules. Advantageously, table 128 will also support a control system and display panel/control board for each of the active modules. Thus, display panel 130 displays the control information for the control system (not illustrated) held within table 128 and used to control sputter etching module 16. Display panel 132 displays the control information for the control system used to control sputtering module 18, display panel 134 displays the control information for the control system used to control pumping stack module 20, and display panel 136 displays the control information for the control system used to control sputtering module 22. Each display panel 130-136 will also include the control inputs for adjusting the sputtering conditions. The particular control systems used to control sputter etching module 16, sputtering modules 18 and 22 and pumping stack module 20 may be conventional and do not form a part of the present invention per se.

In addition, in order to feed the substrate 12 from supply reels 36, 38 to take up reels 40, 42, means must be provided for driving at least the take-up reels 40, 42. As shown in FIG. 1, both take-up reels 40, 42 are mounted on a single drive shaft 138 which in turn is driven by a motor (not illustrated) mounted in a housing 140 on table 128. This particular drive mechanism may be entirely conventional.

In order to increase the versatility of apparatus 10, supply reels 36, 38 may also be driveable by a drive means identical to that which drives take-up reels 40, 42. Thus, supply reels 36, 38 are mounted on a common drive shaft 142 which is driven by a motor (not illustrated) within a housing 144 mounted on table 128. By such construction, the selection of which drive shaft 138, 142 is driven and its direction determines whether supply reels 36, 38 function as supply reels or take-up reels, while take-up reels 40, 42 correspondingly operate as take-up reels or supply reels. Load module 14 then operates as a load or exit module, while exit module 24 operates as an exit or load module.

Figure 6:
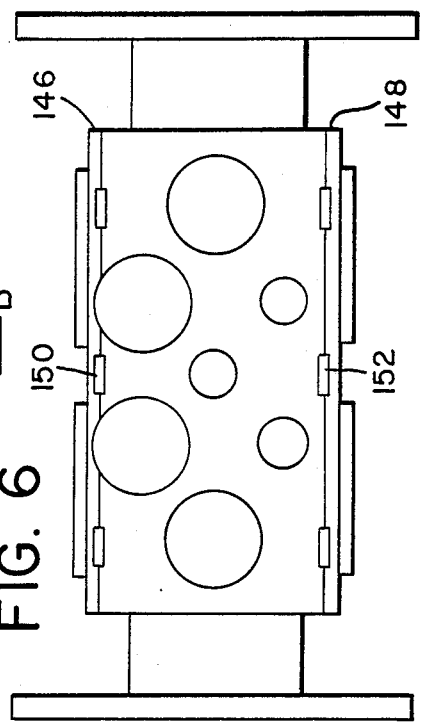
FIG. 6 is a bottom plan view of the sputtering module of FIG. 3.

Turning now to the exterior construction of the sputtering modules themselves, it was noted above that the exterior construction of sputter etching module 16 and sputtering modules 18 and 22 are identical. The following description will therefore be given on sputtering module 18. Referring now to FIGS. 3, 5 and 6, it will be seen that sputtering module 18 includes a plurality of ports 143 on the upper and lower walls thereof. These ports are advantageously used for a variety of purposes, for example, the insertion of a monitoring or sensing device used in the control and maintenance of the sputtering conditions within sputtering module 18. They may also be opened to receive a gas feed line or a vacuum suction line.

In accordance with an aspect of the present invention, each of the two opposed side walls 146, 148 (FIGS. 3 and 6) of sputtering module 18 is constructed as a door which is hinged by hinges 150, 152 to the bottom wall and is openable to permit access to the central sputtering cavity 64 of sputtering module 18. Each door 146, 148, when closed, is adapted to sealingly abut the side surfaces of the top, bottom and end walls of sputtering module 18 with a VITON ® gasket or O-ring (not illustrated) positioned therebetween so as to maintain a vacuum within the central sputtering cavity 64 and to prevent contamination to and from the outside atmosphere. It will be noted that each of these doors 146, 148 can be opened independently of the nuts and bolts used to hold the pairs of abutting flanges together between the modules. Therefore, access may be had to the central sputtering cavity within each module without disassembling apparatus 10. If, for example, display panel 132 indicates a problem in the operation of sputtering module 18, it is possible to shut down the system and to open door 146 or 148 of module 18 to check for problems without disassembling apparatus 10 itself. Such a problem might include, for example, a tangling of substrate 12, which can be physically corrected once access is possible to the central sputtering cavity. As mentioned above, gate valves in the sleeves 70, 72 of sputtering module 18 (or in sleeve 58 of sputter etching module 16 and sleeve 94 of pumping stack module 20) may be closed to isolate the central cavity 64 of sputtering module 18 while door 146 or 148 is open, thus maintaining the evacuation levels in the remaining modules. The two sidewalls/doors 146, 148 of module 18 are identical in construction.

As shown in FIG. 3, door 146 includes two circular port holes 154, 156, while door 148 includes corresponding port holes 158, 160 (FIG. 7). Each of these port holes 154–160 can serve one of a variety of purposes. First, port hole 154 has been constructed as a window, with a center portion 162 constructed of a clear glass or plastic to enable the operator to observe the passage of substrate 12 through sputtering module 18 and, to the extent possible, determine that the sputtering process is proceeding as desired. Secondly, port hole 156 has been constructed to hold a sputtering cathode 164 which is sealingly mounted within port hole 156. Sputtering cathode 164 is designed to be removable from port hole 156 to allow another, similarly constructed sputtering cathode to be mounted therein. Commercially available sputtering cathodes for this purpose are well known. This permits both the interchange of target materials by the use of sputtering cathodes composed of different materials, as well as the replacement of a used sputtering cathode with a fresh sputtering cathode. Any unused port holes may be capped.

Furthermore, the availability of all four port holes 154–160 enables 1, 2, 3 or 4 sputtering cathodes to be mounted on the same sputtering module. Two particular arrangements of sputtering cathodes are advantageous herein. First, when two sputtering cathodes are mounted in directly opposed port holes 156, 160, substrate 12 passing therebetween will directly intercept flux from both directions. Although it is anticipated that in a sputtering process the flux of target material will extend and surround substrate 12 even from a single cathode, it has been found in practice that the coverage is not entirely uniform, so that the use of opposed cathodes is advantageous. A further advantage in having opposed sputtering cathodes is that material ejected from one cathode which misses substrate 12 will be at leas partially deposited on the opposite cathode, thus partially re-coating the cathode with target material. This increases the useful life of the cathode and reduces the percentage of wasted target material, which is particularly advantageous when the target material is a precious metal. When a liner is also used, as discussed below, there is virtually complete use or reclamation of target material.

Secondly, when magnetron sputtering is employed, it has been found that the use of a magnetic target material on two directly opposed sputtering cathodes can interfere with the proper formation of the the magnetic fields and produces a distortion of the flux. Specifically the magnetic fields cannot pass through the magnetic target material and so the target material is pushed outwardly from the cathodes towards the center cavity 64 of sputtering module 18. It is a discovery of the present inventors, however, that when two sputtering cathodes are arranged in a diagonal pair, as, for example, in port holes 156 and 158, the resultant magnetic fields create a uniform target material flux in the center of sputtering module 18 and therefore provide uniform coating over all surfaces of substrate 12. This arrangement may, of course, be used with non-magnetic target material as well.

Figure 8:
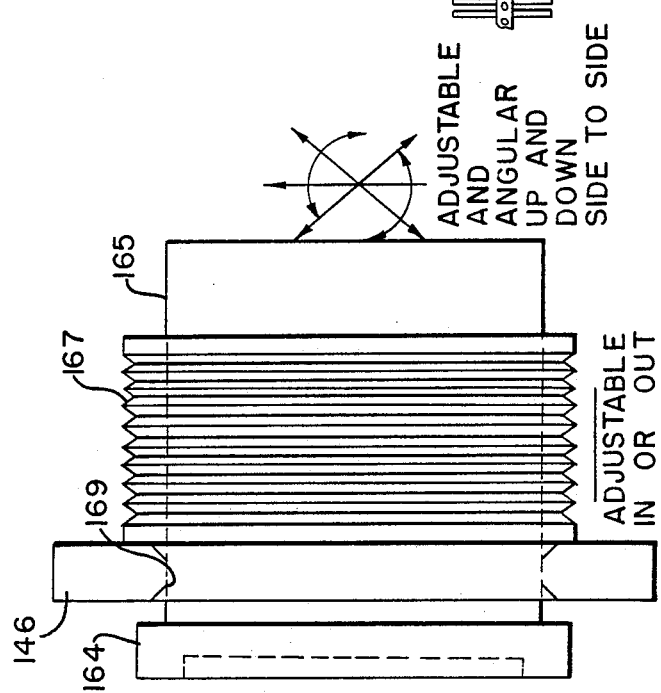
FIG. 8 is a side elevational view of a cathode mounting system for the sputtering module of FIG. 3

As shown in FIG. 8, sputtering cathode 164 may be mounted upon a piston 165 which in turn is slidingly received in port hole 156. A bellows 167 provides a seal between piston 165 and door 146. This enables sputtering cathode 164 to be moved perpendicularly to sidewall/door 146 to bring it closer to substrate 12 at a desired distance therefrom. This will increase the flux density of target material at substrate 12 without requiring a corresponding increase in the density of bombarding argon ions. Sputtering cathode 164 may also be rotated using this construction. The interior surface of porthole 156 may have a V-shaped configuration 169, in which case piston 165 may be angularly adjusted or cocked up or down, side to side, or at any compass direction if such is advantageous in a particular application.

FIG. 9 illustrates the inside construction of door 146, with window 162 mounted in port hole 154 and sputtering cathode 164 mounted within port hole 156. A loop anode 166 is provided from a mounting pin 168 to extend over and around the outer edge sputtering cathode 164. Anode 166 connected to the positive terminal of the DC power supply completes the electrical circuit. It attracts the electrons which in turn ionize the argon atoms and accelerates the argon ions towards sputtering cathode 164, in accordance with known principles.

It will be understood, of course, that an additional sputtering cathode could be mounted in port hole 154, in which case a second anode would be mounted from a second mounting pin 170.

FIG. 5 illustrates two other advantageous features of the apparatus according to the present invention. First, it is well known that the atoms of target material forming the sputtering flux will eventually collide with and adhere to one of the interior surfaces of sputtering module 18. The presence of the accumulated layer is disadvantageous during later sputtering processes, particularly when a new cathode of a new target material has been inserted in port hole 156, so that the adhered layer constitutes a source of contaminating atoms. Therefore, liners 172, 174 are provided to line the surfaces of the top and bottom walls of sputtering module 18. These liners 172, 174 maybe most simply formed of aluminum foil and may be removed and replaced by new liners when door 146 is opened. The use of aluminum foil as the lining material is also advantageous when the target material is a precious metal, for example, gold. The aluminum foil bearing the layer of gold can be simply dropped into an acid bath in which it dissolves and the gold may then be recovered. Such lining material may also, if desired, be fitted to the inside surface of doors 146, 148 with appropriate openings for the port holes therein, and may be also extended to the end walls.

A second advantageous feature of the present invention is the provision of selective sputtering in which only a selected portion of substrate 12 is coated with target material. As illustrated in FIG. 5, a mask, which is advantageously a fixed mask 176, is used to shield a portion of substrate 12 from the flux of target material, so that only the exposed portion of substrate 12 is coated. For example, using the bandolier substrate 12 illustrated in FIG. 2, it may be desirable to coat only the tips 32, 34 of the metal strips 26. In such case, it is necessary to shield the central portion 30 of each metal strip 26. FIG. 10 illustrates that this shielding may be accomplished by hanging the strip-like mask 176 in close proximity to center portions 30 of metal strips 26 on substrate 12 so as to intercept the flux of target atoms before they reach substrate 12. Mask 176 may be suspended from the top wall of sputtering module 18 by means of brackets 178, 180, or may be suspended from the bottom or suspended from the sidewalls by similar means. The placement of mask 176 is selected to correspond to the desirable nonexposed portion of substrate 12.

FIG. 7 gives a top view of mask 176 and brackets 178, 180. As shown therein, mask 176 actually consists of two halves 176a and 176b which respectively closely overlie one side of central portions 30 of metal strips 26. Brackets 178 and 180 are therefore each formed of two side brackets 178a, 178b and 180a, 180b. Each half mask has 176a, 176b includes outwardly curved inner end surfaces 182a, 182b so that substrate 12 may be fed into and through mask halves 176a, 176b without snagging on any corners thereof. It will be remembered that substrate 12 may be fed through apparatus 10 in either direction, so the curved inner end surfaces 182a, 182b are provided at both ends of mask halves 176a, 176b.

It is advantageous for the inner mask surfaces to be as close as possible to substrate 12 to provide the maximum shielding effect. Therefore, since the particular substrate 12 illustrated in FIG. 2 includes an expanded central portion 30, mask halves 176a, 176b are specially configured to include central notches 184a, 184b running down the center of mask halves 176a, 176b, respectively, as illustrated in FIG. 10. It will be understood by one skilled in the art that mask 176 may be configured in any specific form in dependence on the particular substrate to be coated, and further that different masks may be substituted within sputtering module 18 (or sputtering module 22) in dependence on the particular process selected at that time.

Figure 12:
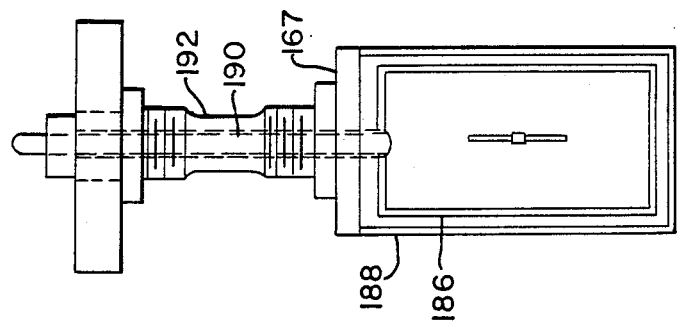
FIG. 12 is a front cross sectional view of FIG. 11.
Figure 11:
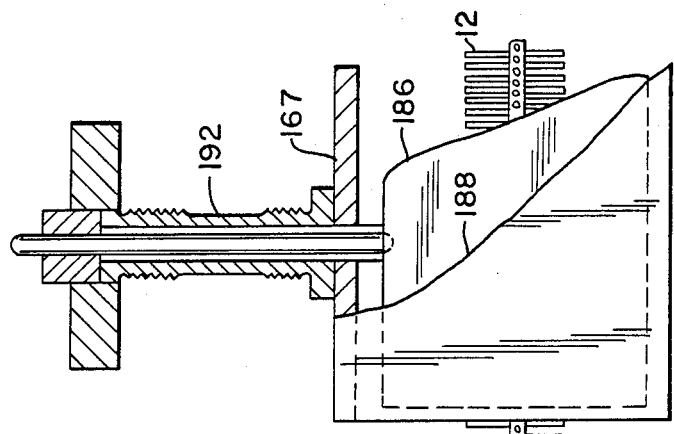
FIG. 11 is an elevational view, partly in cross section, of the etching elements of a sputter etching module of the apparatus of FIG. 1.

Sputter etching module 16 also has an advantageous interior construction. The substrate 2 will be at ground potential because it is connected to the ground formed by supply and take-up reels 36–42. As shown in FIGS. 11 and 12, the central sputtering cavity 50 of sputter etching module 16 includes therein a sleeve 186 suspended from a mounting plate 187 which defines in its interior the etching chamber through which substrate 12 passes to be sputter etched. Sleeve 186 is located in the center of sputter etching module 16 and extends only over part of the length thereof. Surrounding sleeve 186 is a second sleeve 188, which is connected to ground within the control system for sputter etching module 16, and so forms a ground plane shield around sleeve 186. The argon gas is fed directly inside sleeve 186 into the sputter etching cavity through a gas feed line 190 inserted through one of the ports on the top wall of sputter etching module 16. The negative voltage terminal DC power supply is advantageously set at ground potential. A commercial high voltage vacuum feed is used to introduce the positive voltage from the DC power supply to sleeve 186. Mounting plate 187 is supported by a non-conducting, adjustable height support 192 passing through the upper wall of sputter etching module 16. It is further insulated from the ground potential of the sputter etching module 16 itself and outer sleeve 188 by the vacuum produced during the sputtering process. Outer sleeve 188 thus serves as a ground plane or dark space shield which insures that the high voltage gas discharge occurs primarily between substrate 12 and sleeve 186. Since the speed of passage of substrate 12 through apparatus 10 is usually determined by such factors as the sputtering rate of the target materials after the sputter etching/cleaning process is completed, the voltage and current at the DC power supply are adjusted to ensure that sufficient sputtering occurs during transit of substrate 12 through sleeve 186.

It may be advantageous that substrate 12 be tensioned during its passage from load module 14 to exit module 24 so that it does not sag or become distorted. To this end, one or more sets of positioning/tensioning rollers 194 (FIG. 7) may be located in any one of the sleeves on any one of the modules. Another of the advantages of the use of such sets of rollers is that they may be inclined with respect to the supply and take-up reels. If one such set of inclined tensioning rollers is the placed in a sleeve prior to the central sputtering chamber 50 of sputter etching module 6 and one is placed after the central sputtering chamber 78 of sputtering module 22, then substrate 12 itself will be inclined at the selected angle during its passage through apparatus 10. This may be of advantage when it is desired to coat articles mounted on a web which are of uneven configuration and in which a tilted orientation would be advantageous.

Furthermore, it will be noted that the structure of pumping stack module 20 permits the attachment of one or more vacuum pumps 123 thereto at any orientation. It is well known in the art that cryopumps will operate whether they are horizontal or vertical. Therefore, the entire apparatus 10 may be suspended vertically, with load module 14 at the top and exit module 24 at the bottom, and substrate 12 will then pass through apparatus 10 from top to bottom. This is advantageous when the substrate 12 itself is heavy and may sag during a horizontal passage. Cryopumps, which operate in any orientation, are advantageous. The use of two or more vacuum pumps, such as cryopumps on pumping stack module 20 also reduces any potential down time of apparatus 10. Such cryopumps must be regenerated from time to time, and when only a single cryopump is used for pumping any particular module, the entire apparatus 10 has to be shut down during such regeneration. A second cryopump 123 also attached to pumping stack module 20 at a second port could be operated during the regeneration period of the first cryopump, so that down time due to this factor would be eliminated.

Although the illustrated embodiment of the present invention has been described in detail herein with reference to the accompanying drawings, it is to the understood that the invention is not limited to the precise embodiment, and that various changes and modifications can be effected therein by one skilled in the art without departing from the scope and spirit of the invention as defined in the appended claims.

What is claimed:

1. A method for sputter coating multiple surfaces of a portion of a substrate with a target material, comprising:

passing a substrate through a sputtering module in a longitudinal direction of said module, said module having at least two longitudinal walls between which passes said substrate having multiple surfaces;

generating a sputtered flux of target material from a target mounted at each of said longitudinal walls of said module, at least one of said longitudinal walls including positioning means for moving said target with respect to said respective longitudinal wall so as to locate said target at a selected position with respect to said substrate; and shielding a selected portion of said substrate from said flux by interposing a mask between said target and said substrate and in close proximity to said selected portion, whereby only a remaining portion of said substrate is coated with said target material.

2. Apparatus for sputter coating multiple surfaces of a portion of a substrate with a target material, comprising:

a sputtering module having at least two longitudinal walls between which passes in a longitudinal direction of said module a substrate having multiple surfaces;

sputtering target means mounted at each of said longitudinal walls for providing a flux of target material from said sputtering target means towards said substrate, at least one of said longitudinal walls including positioning means for moving said sputtering target means with respect to said respective longitudinal wall so as to locate said sputtering target means at a selected position with respect to said substrate; and masking means mounted within said module and interposed between said sputtering target means and said substrate and in close proximity to a selected portion of said substrate for shielding said selected portion of said substrate from said flux of target material, whereby only a remaining portion of said substrate is coated with said target material.

3. Apparatus according to claim 2, wherein said masking means is stationary within said module.

4. A modular sputtering apparatus, comprising:

at least first and second sputtering modules sealingly connected in series;

said first sputtering module defining a first effective sputtering cavity and being adapted to sputter a first target material onto a substrate within said first effective sputtering cavity under first sputtering conditions, said first target material having a first mean free path under said first sputtering conditions;

said second sputtering module having a second effective sputtering cavity and being adapted to sputter a second target material onto a substrate within said second effective sputtering cavity under second sputtering conditions, said second target material having a second mean free path under said second sputtering conditions; and a distance between said first and second cavities being at least as long as twice the longest of said first and second mean free paths.

5. Apparatus according to claim 4; and further comprising:

a load module including an end wall having an aperture therein and a sleeve extending from said end wall and surrounding said aperture, said sleeve having an outwardly directed flange at a free end thereof;

a pumping stack module including a vacuum cavity with first and second opposed sleeves and at least a third sleeve each having an outwardly directed flange at a free end thereof, said third sleeve having at least one vacuum pump attached thereto;

an exit module including an end wall having a aperture therein and a sleeve extending from said end wall and surrounding the aperture therein, said sleeve of said exit module having an outwardly directed flange at a free end thereof;

means within said load module for supplying a substrate therefrom;

means within said exit module for receiving said substrate thereat;

each of said sputtering cavities defining a central sputtering chamber including first and second opposed end walls with respective apertures therein and having first and second sleeves extending from said first and second end walls, respectively, and surrounding the respective apertures, each of said first and second sleeves having an outwardly directed flange at a free end thereof;

each of said flanges on each of said sleeves being adapted to sealingly abut another one of said flanges on another one of said modules so that said first and second sputtering modules and said pumping stack module may be serially arranged between said load module and said exit module with said vacuum cavity and all of said apertures being in alignment to form a sealed passage, said substrate being passed form said load module through said sealed passage to said exit module; and externally accessible securing means for respectively releasibly securing together abutting ones of said flanges, whereby said first and second sputtering modules and said pumping stack module may be serially arranged between said load module and said exit module in any order.

6. Apparatus according to claim 5; wherein all of said sleeves on all of said sputtering modules are of identical construction.

7. Apparatus according to claim 5; wherein all of said flanges on all of said modules are of identical construction.

8. Apparatus according to claim 5; wherein one of said sputtering modules is arranged next following said load module and is a sputter etching module adapted to sputter etch said substrate.

9. Apparatus according to claim 8; wherein said sputter etching module includes an etching chamber within the central sputtering chamber therein which is formed of a conducting material and through which said substrate passes, said etching chamber being connected to the negative terminal of a dc power supply and being surrounded within said central sputtering chamber by a ground plane shield, said sputter etching module further including gas feed means for feeding a sputter etching gas directly inside said etching chamber.

10. Apparatus according to claim 9 including means for connecting said substrate to ground.

11. Apparatus according to claim 5; wherein each of said sputtering modules includes first and second opposed sidewalls extending between said first and second end walls, at least one of said first and second sidewalls being formed as a door which is openable independently of the respective securing means for permitting access to the central sputtering chamber of the respective sputtering module.

12. Apparatus according to claim 11; wherein at least one of said doors in at least one of said sputtering modules has a sputtering cathode mounted thereon.

13. Apparatus according to claim 12; wherein said door having said sputtering cathode mounted thereon includes positioning means for moving said sputtering cathode with respect to the respective sidewall so as to locate said sputtering cathode at a selected position with respect to said substrate.

14. Apparatus according to claim 13, wherein said positioning means moves said sputtering cathode perpendicularly with respect to the respective sidewall to locate said sputtering cathode at a selected distance from said substrate.

15. Apparatus according to claim 12; wherein the other of said first and second sidewalls is formed as another of said doors.

16. Apparatus according to claim 15; wherein at least a first one of said doors on at least one of said sputtering modules has a sputtering cathode mounted thereon.

17. Apparatus according to claim 16; wherein the second one of said doors on said one sputtering module has a second sputtering cathode mounted thereon.

18. Apparatus according to claim 5; wherein each of said sputtering modules includes top and bottom walls extending between said first and second end walls, each of said sputtering modules further including a removable liner positioned intermediate said substrate and at least one of said top and bottom walls and substantially covering said one of said top and bottom walls.

19. Apparatus according to claim 5; wherein each of said sleeves on each of said sputtering modules includes gas seal means for preventing the flow of gas therethrough.

20. Apparatus according to claim 5; wherein at least one of said sputtering modules includes masking means for shielding a portion of said substrate from said target material.

21. Apparatus according to claim 5; wherein said apparatus includes a serial arrangement of said load module, a first one of said sputtering modules adapted to sputter etch said substrate, a second one of said sputtering modules adapted to cover at least a first portion of the etched substrate with a first target material, said pumping stack module, a third one of said sputtering modules adapted to cover at least a second portion of the covered substrate with a second target material, and said exit module.

22. Apparatus according to claim 5; wherein said pumping stack module includes a plurality of ports each adapted to receive a respective vacuum pump.

23. Apparatus according to claim 22; wherein each of said vacuum pumps is a cryopump.

24. Apparatus according to claim 5; wherein said substrate is elongated, said means for supplying said substrate includes a supply reel around which said substrate is wound, and said means for receiving said substrate includes a take-up reel for taking up said substrate and drive means for driving said take-up reel.

25. Apparatus according to claim 24; wherein said drive means drives said take-up reel so as to feed said substrate continuously through said sealed passage.

26. Apparatus according to claim 25; wherein said drive means drives said take-up reel so as to feed said substrate through said sealed passage in step-wise fashion.

27. Apparatus according to claim 25; further comprising a set of tensioning rollers positioned in one of said sleeves of one of said modules for tensioning said substrate.

28. Apparatus according to claim 27, further comprising a second set of tensioning rollers positioned in a second one of said sleeves, said first and second sets of positioning rollers holding said substrate at an acute angle with respect to said supply reel.

29. A modular sputtering apparatus for coating a substrate with a target material, said apparatus comprising:
a load module including an end wall having an aperture therein and a sleeve extending from said end wall and surrounding said aperture, said sleeve having an outwardly directed flange at a free end thereof;
at least two sputtering modules each including a central sputtering chamber having first and second opposed end walls with respective apertures therein and having first and second sleeves extending from said first and second end walls, respectively, and surrounding the respective apertures, each of said first and second sleeves having an outwardly directed flange at a free end thereof wherein: one of said sputtering modules is adapted to sputter a first target material onto said substrate under first sputtering conditions, said first target material having a first mean free path under said first sputtering conditions; and the other of said sputtering modules is adapted to sputter a second target material onto said substrate under second sputtering conditions, said second target material having a second mean free path under said second sputtering conditions;
a length of each of the sleeves of said sputtering modules being at least as great as the longer of said first and second mean free paths;
a pumping stack module including a vacuum cavity with first and second opposed sleeves and at least a third sleeve each having an outwardly directed flange at a free end thereof, said third sleeve having at least one vacuum pump attached thereto;
an exit module including an end wall having a aperture therein and a sleeve extending from said end wall and surrounding the aperture therein, said sleeve of said exit module having an outwardly directed flange at a free end thereof;
means within said load module for supplying a substrate therefrom;
means within said exit module for receiving said substrate thereat;
each of said flanges on each of said modules being adapted to sealingly abut another one of said flanges on another one of said modules so that said first and second sputtering modules and said pumping stack module may be serially arranged between said load module and said exit module with said vacuum cavity and all of said apertures being in alignment to form a sealed passage, said substrate being passed from said load module through said sealed passage to said exit module; and
externally accessible securing means for respectively releasibly securing together abutting ones of said flanges, whereby said first and second sputtering modules and said pumping stack module may be serially arranged between said load module and said exit module in any order.

30. A modular sputtering apparatus for coating a substrate with a target material, said apparatus comprising:

a load module including an end wall having an aperture therein and a sleeve extending from said end wall and surrounding said aperture, said sleeve having an outwardly directed flange at a free end thereof;

at least two sputtering modules each including a central sputtering chamber having first and second opposed end walls with respective apertures therein and having first and second sleeves extending from said first and second end walls, respectively, and surrounding the respective apertures, each of said first and second sleeves having an outwardly directed flange at a free end thereof, wherein each of said sputtering modules includes first and second opposed sidewalls extending between said first and second end walls, at least one of said first and second sidewalls having sputtering target means mounted thereon, said sidewall having said sputtering target means mounted thereon also including positioning means for moving said sputtering target means with respect to said side wall so as to locate said sputtering target means at a selected position with respect to said substrate;

a pumping stack module including a vacuum cavity with first and second opposed sleeves and at least a third sleeve each having an outwardly directed flange at a free end thereof, said third sleeve having at least one vacuum pump attached thereto;

an exit module including an end wall having a aperture therein and a sleeve extending from said end wall and surrounding the aperture therein, said sleeve of said exit module having an outwardly directed flange at a free end thereof;

means within said load module for supplying a substrate therefrom;

means within said exit module for receiving said substrate thereat;

each of said flanges on each of said modules being adapted to sealingly abut another one of said flanges on another one of said modules so that said first and second sputtering modules and said pumping stack module may be serially arranged between said load module and said exit module with said vacuum cavity and all of said apertures being in alignment to form a sealed passage, said substrate being passed from said load module through said sealed passage to said exit module; and externally accessible securing means for respectively releasibly securing together abutting ones of said flanges, whereby said first and second sputtering modules and said pumping stack module may be serially arranged between said load module and said exit module in any order.

* * * * *

UNITED STATES PATENT AND TRADEMARK OFFICE
CERTIFICATE OF CORRECTION

PATENT NO. : 4,911,810

DATED : March 27, 1990

INVENTOR(S) : Michael P. Lauro et al

It is certified that error appears in the above-identified patent and that said Letters Patent is hereby corrected as shown below:

ON THE TITLE PAGE:

[75] Inventors, delete "Everett E. Crisman".

Signed and Sealed this

Tenth Day of September, 1991

Attest:

HARRY F. MANBECK, JR.

*Attesting Officer*

*Commissioner of Patents and Trademarks*